United States Patent [19]

Shah et al.

[11] Patent Number: 4,862,402

[45] Date of Patent: Aug. 29, 1989

[54] FAST MULTIPLIERLESS ARCHITECTURE FOR GENERAL PURPOSE VLSI FIR DIGITAL FILTERS WITH MINIMIZED HARDWARE

[75] Inventors: Imran A. Shah, North White Plains; Arup K. Bhattacharya, Peekskill, both of N.Y.

[73] Assignee: North American Philips Corporation, New York, N.Y.

[21] Appl. No.: 890,247

[22] Filed: Jul. 24, 1986

[51] Int. Cl.⁴ ........................................... G06F 15/31
[52] U.S. Cl. ............................................. 364/724.12
[58] Field of Search ............... 364/724, 728, 724.03, 364/724.12, 724.16, 728.01

[56] References Cited

U.S. PATENT DOCUMENTS

| 3,521,042 | 7/1970 | Blerkom et al. | 364/724 |
| 3,670,151 | 6/1972 | Lindsay et al. | 364/728 |
| 3,732,409 | 5/1973 | Fletcher et al. | 364/724 |
| 3,831,013 | 8/1974 | Alsup et al. | 364/728 |
| 4,031,364 | 6/1977 | Wilmot | 364/724 |
| 4,237,551 | 12/1980 | Narasimha | 364/724 |
| 4,559,606 | 12/1985 | Jezo et al. | 364/728 |
| 4,641,259 | 2/1987 | Shan et al. | 364/724 |
| 4,644,488 | 2/1987 | Nathan | 364/724 |
| 4,660,164 | 4/1987 | Leibowitz | 364/728 |
| 4,736,335 | 4/1988 | Barkan | 364/758 |
| 4,745,570 | 5/1988 | Dudrich et al. | 364/760 |

FOREIGN PATENT DOCUMENTS

| 0015681 | 9/1980 | European Pat. Off. | 364/724 |
| 0166653 | 2/1986 | European Pat. Off. | |
| 0162937 | 12/1979 | Japan | 364/724 |
| 0007716 | 1/1986 | Japan | 364/724 |
| 0007717 | 1/1986 | Japan | 364/724 |
| 2095067 | 9/1982 | United Kingdom | 364/724 |

OTHER PUBLICATIONS

Greenberger, A. J.: "Digital Transversal Filter Architectures", *Electronics Letters*, vol. 21, #3, pp. 86-88, 1/31/85.

Zohar, S: "New Hardware Realizations for Non-Recursive Digital Filters", *IEEE Trans. Comput.*, vol. C-22, No. 4, pp. 328-338, 4/73.

Papadoulos et al: "Cellular Pipelined Digital Filters", *Radio and Electronic Engineer*, vol. 49, No. 12, pp. 643-648, Dec. 1979.

Soderstand et al: "VLSI Implementation in Multiple-Valued Logic of an FIR Digital Filter Using Residue Number System Logic", *IEEE Trans. on Circuits and Systems*, vol. CAS-33, No. 1, pp. 5-21.

*Primary Examiner*—Gary V. Harkcom
*Assistant Examiner*—Dale M. Shaw
*Attorney, Agent, or Firm*—Thomas A. Briody; Jack E. Haken; Jack D. Slobod

[57] ABSTRACT

A digital transversal filter which employs a multiplierless algorithm for effecting convolutions of samples of a digital input word by the filter coefficients. Each of the samples of an input word is bit sliced into segments of two or more bits, and convolutions are carried out in parallel on all segments using only adders and registers. The convolution products are then summed in a pipeline adder tree to derive the convolution of the complete input word. This architecture provides high frequency capability and significantly lower transistor count and hardware complexity, enabling efficient very large scale integration (VLSI) implementation.

10 Claims, 12 Drawing Sheets

FIG.1
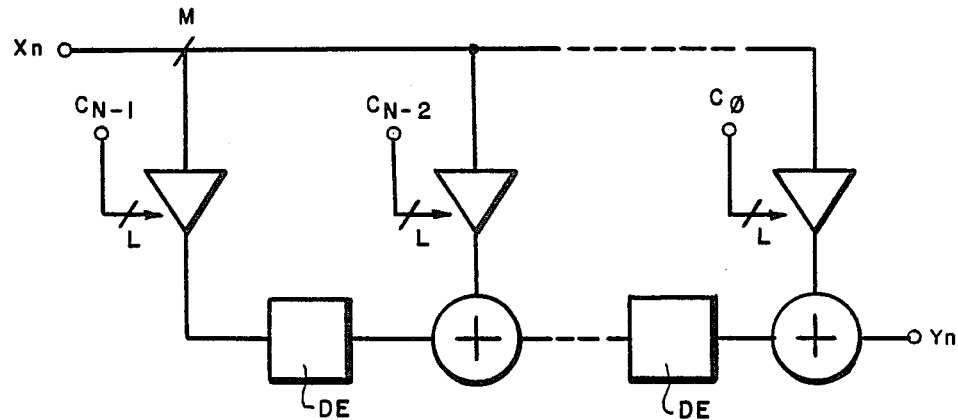
FIG.2a
FIG.2
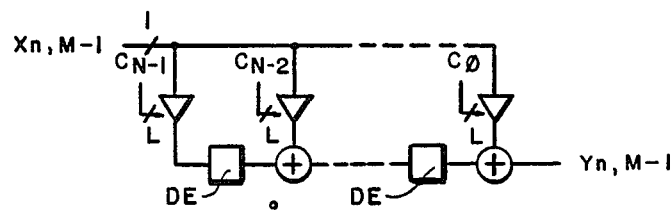
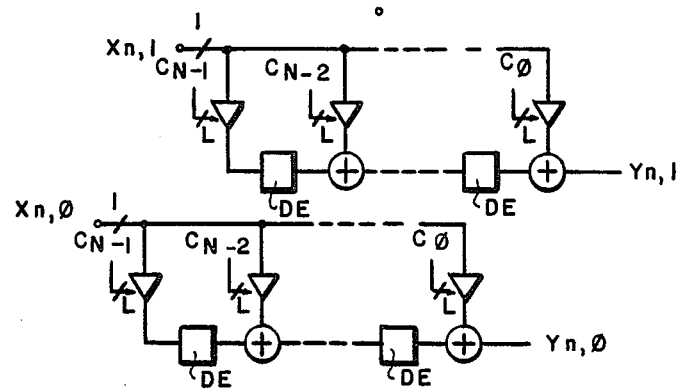

$$\text{OUTPUT} = \sum_{i=0}^{N-1} X_{n-i}$$

$$\text{OUTPUT} = \sum_{i=0}^{N-1} C_i$$

FAST MULTIPLIERLESS ARCHITECTURE FOR GENERAL PURPOSE VLSI FIR DIGITAL FILTERS WITH MINIMIZED HARDWARE

BACKGROUND OF THE INVENTION

1. Field of the Invention

This invention pertains to digital filters, and in particular to finite impulse response filters, transversal filters or any other filter involving the calculation of a convolution.

2. Description of the Prior Art

Filtering is one of the most important functions of real time linear signal processing. Among the different types of digital filters there has been a great deal of interest in finite impulse response (FIR) digital filters (also called transversal filter). The reason for this is that powerful and mature optimization theories exist to aid in the filter design. FIR filters can easily be designed to approximate a prescribed magnitude/frequency response to arbitrary accuracy with an exactly linear phase characteristic. The non-recursive FIR filters contain only zeroes in the finite z-plane and hence are always stable. These features make them very attractive for most digital signal processing applications.

The FIR filter is characterized by the input/output relation $$Y_n = \sum_{i=0}^{N-1} C_i X_{n-i} \quad (1)$$

where $X_{n-i} = X\{t_n - iT_s\}$ is the sampled input signal, Ci is the weighting coefficient and $Y = Y\{t_n\}$ is the corresponding output signal. $T_s$ is the sampling period, $t_n - nT_s$ are sample instances and $f_s = 1/T_s$ is the sample rate. So each output sample is the weighted sum of a finite number of input samples (N in Equation 1).

In classical realization of Equation 1, the weighting of the input samples is accomplished by multipliers (FIG. 1). The multiplier is the most time consuming and expensive building block of the filter, thus there has been a great effort to make the multiplication operation cheaper and faster to increase the overall speed of operation of the filter.

Most authors in this field have approached this problem by severely restricting the coefficient space, many allowing only power of two coefficients to exist. This results in a remarkably simple architecture which requires no multipliers since power of two scaling is performed by simple shifts of the signal samples. However, this restriction also compromises the filter performance, making it very difficult to meet the desired frequency response. This limitation has been dealt with in different ways. In one prior art embodiment, basic building blocks of powers of two filter stages are designed and then combined in cascade and/or parallel with appropriate power of two scaling (on a trial and error basis) to achieve the desired frequency response. Cf. R. C. Aggarwal, R. Sudhakar, "Multiplier-Less Design of FIR Filters", ICASSP 1983, pp. 209–212.

Another proposed technique eliminates the multipliers but the price is paid in having to use oversampling, greater filter lengths and recursive stages. An alternative approach in the so-called power of two FIR filters has been the use of prefilter/compensating technique to compensate for the limitation of the coefficient space. Bateman and Liu "An Approach to Programmable CTD Filters Using Coefficients 0, +1, and −1", IEEE Trans. on CAS, Vol. CAS-27, pp. 451–456, June 1980, proposes filter structures restricting coefficients to 0, 1 and −1 only. The result is extremely long filters, obtained after a complicated design process.

Even though these techniques have shown theoretical promise, they often result in longer filters (a greater number of taps) and extremely complicated design procedures, hence they have limited commercial appeal.

Significant research effort has also been directed toward architectural simplification of the multiplication operation, taking advantage of the expression of Equation 1. A fast but extremely expensive architecture has been proposed using Multi Valued Logic (MVL) and Residue Number System (RNS). Cf. M. A. Soderstand, R. A. Escott, "VLSI Implementation in Multiple-Valued-Logic of an FIR Digital Filter Using Residue Number System Architecture", IEEE Trans. on Circuits and Systems, Vol. CAS-33, No. 1, Jan. 1986. An alternative novel technique has been proposed using an architecture based on implementing Equation 1 on a bit level. Cf. A. J. Greenberger, "Digital Transversal Filter Architecture", Electronics Letters, 31 Jan. 1985, Vol. 21, No. 3. The increased speed came by taking advantage of bit slicing and distributed arithmetic. The technique performs the FIR convolution using accumulators to accumulate products of one bit coefficients with the entire input word length. This requires as many planes of accumulators as bits in the coefficients words. In addition, it needs special control circuitry to perform the operation. It also uses the more complex tri-state buffers increasing the equivalent gate count. The overall architecture is a complicated way of looking at the convolution of Equation (1). All the above features put together result in an architecture which approaches a multiplier implementation of the filter in complexity. This makes it inefficient and uneconomical for VLSI implementation. Some ideas were successful in increasing the speed tremendously, but their implementation/hardware complexity made a practical VLSI implementation prohibitive.

This application discloses an architecture which obtains the same speed of operation as the fastest prior art proposal, but uses substantially less hardware. The architecture of the present invention does not impose any restriction on the coefficient or the data sample space, and requires no special design consideration on the part of the user.

SUMMARY OF THE INVENTION

A novel multiplierless algorithm for calculating the convolution of a Finite Impulse Response (FIR) digital filter is based on the partial slicing of input data vector words and performing the convolution in a disturbed fashion. A fast, flexible and efficient architecture for implementing the algorithm performs the convolution by partially slicing the input sample word in groups of two or more bits along with pre-calculating and storing partial products results. This method reduces the number of planes of adders and latches (we do not use any tri-state buffered accumulators or control circuitry) by half or more depending upon the size of the partial slice. Simulation results of the multiplication operation demonstrate the high frequency capability of the architecture. Comparative results reveal the significantly low transistor count and hardware complexity, enabling efficient VLSI implementation. The structure is capable of very high speed operation, well within video frequencies. The filter coefficients can be dynamically updated for adaptive filtering applications.

The filter can easily be expanded in number of taps and/or word length of coefficient and data samples. The partial slicing of the input data sample results in tremendous reduction in the gate-count of the filter, hence making it very attractive for VLSI implementation.

Beginning with a multiplierless FIR filter algorithm and its architectural realization, modifications are made to this algorithm to yield an equally fast, but substantially cheaper architecture. The flexibility of the proposed architecture is discussed and some circuit minimization considerations are presented. A prototype VLSI implementation of the concept and speed simulation results are presented. The architecture compared with the previously proposed architecture achieves savings in transistor count which make this architecture extremely attractive for VLSI implementation.

In a first version of the algorithm, the input word is sliced into bits and each bit is processed in parallel, using only adders and a pipeline adder. A modification to the algorithm is based on partial slicing of an input data sample word into groups of two or more bits. This modified algorithm is mapped onto an architecture which uses only decoders, adders and registers. The effect of multiplying two or more bits by a coefficient in binary notation is achieved by precalculating and storing odd multiples of the coefficient in registers and shifting to obtain even multiples of the coefficients. Thus, the effect of multiplication is achieved by shifting, by decoding or by addressing a register. All partial slices of an input word are processed simultaneously, using one set of registers for each prestored odd multiple of a coefficient. Partial sums are then fed to a minimized pipeline adder, again using shifting to minimize hardware and increase speed.

BRIEF DESCRIPTION OF THE DRAWINGS

FIG. 1 is a block diagram of the classical prior art realization of an FIR filter;

FIG. 2 is a simplified block diagram showing an implementation of the algorithm of the present invention;

FIG. 3b is an example of an addition with the pipeline adder tree of FIG. 3a;

DESCRIPTION OF THE PREFERRED EMBODIMENTS

Multiplierless FIR Filter Algorithm

Figure 3A:
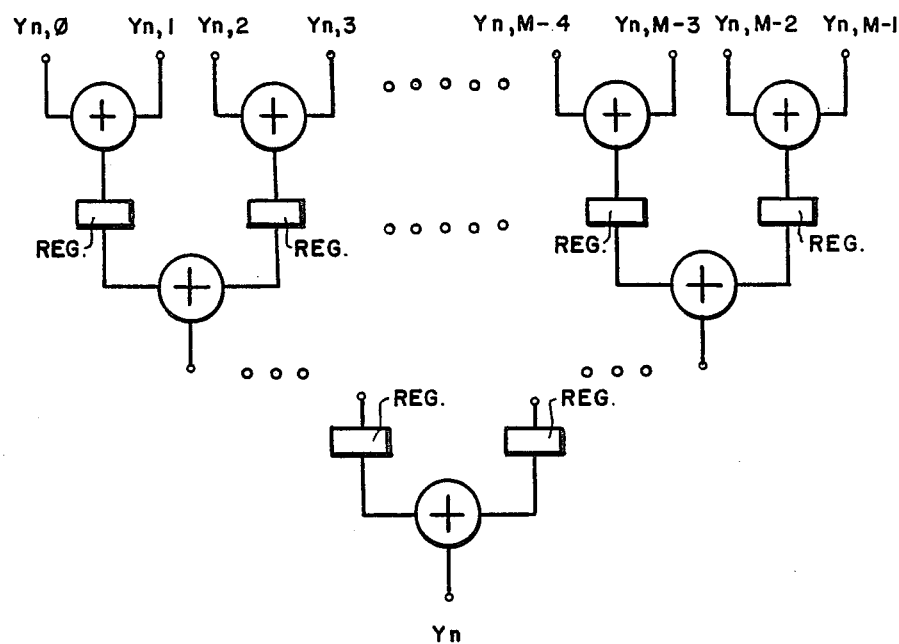
FIG. 3a is a block diagram of a pipeline adder tree used with implementation of FIG. 2.

As noted above in Equation 1 the FIR filtering operation can be expressed as the following convoluted sum $$Y_n = \sum_{i=0}^{N-1} C_i X_{n-i} \tag{1}$$

where $Y_n$, $X_n$ and $C_n$ are the $n^{th}$ output, input and coefficient values respectively. The bold face characters indicate finite precision (quantized) samples and coefficients.

Assume that the input samples $X_n$ are represented by M bits and the coefficients $C_i$ by L bits. Then, $X_n$ can be written in terms of its binary representation as:

$$X_n = \sum_{k=0}^{M-1} x_{n,k} 2^k, \text{ for all } n \tag{2}$$

where $x_{n,k}$ is the $k^{th}$ sigificant bit of $X_n$. Similarly the coefficients are represented by $$C_i = \sum_{j=0}^{L-1} c_{i,j} 2^j \tag{3}$$

where $i = 0, 1, 2, \ldots, N-1$

For coefficients less than unity, the sum is multiplied by $2^{-L}$ corresponding to a shift in binary point. Substituting Equations 2 and 3 in Equation 1 we get:

$$Y_n = \sum_{i=0}^{N-1} \sum_{j=0}^{L-1} c_{i,j} 2^j \sum_{k=0}^{M-1} x_{n-i,k} 2^k \tag{4}$$

Rearranging the order of summation in Equation 4 we have:

$$Y_n = \sum_{k=0}^{M-1} \left( \sum_{i=0}^{N-1} x_{n-i,k} \sum_{j=0}^{L-1} c_{i,j} 2^j \right) 2^k = \sum_{k=0}^{M-1} \left( Y_{n,k} \right) 2^k \tag{5}$$

Some authors use a different arrangement of Equation 5, but we find Equation 5 to be most efficient in fully parallel implementation.

The term inside the brackets represents the convolution of the $k^{th}$ significant bit of the input sequence with the L bit coefficients. This can be implemented by a simple AND operation. By splitting up the complete M bit word by L bit word convolution into a summation of bit word by L bit word convolutions we have bit sliced our filter into M bit planes - one plane for each significant bit of the data word. The following M convolutions can be implemented in parallel to compute the term inside the brackets.

$$Y_{n,0} = x_{n,0} \sum_{j=0}^{L-1} c_{0,j} 2^j + x_{n-1,0} \sum_{j=0}^{L-1} c_{1,j} 2^j + \ldots + x_{n-N+1,0} \sum_{j=0}^{L-1} c_{N-1,j} 2^j \quad (6)$$

$$Y_{n,1} = x_{n,1} \sum_{j=0}^{L-1} c_{0,j} 2^j + x_{n-1,1} \sum_{j=0}^{L-1} c_{1,j} 2^j + \ldots + x_{n-N+1,1} \sum_{j=0}^{L-1} c_{N-1,j} 2^j$$

$$\vdots$$

$$Y_{n,M-1} = x_{n,M-1} \sum_{j=0}^{L-1} c_{0,j} 2^j + x_{n-1,M-1} \sum_{j=0}^{L-1} c_{1,j} 2^j + \ldots + x_{n-N+1,M-1} \sum_{j=0}^{L-1} c_{N-1,j} 2^j$$

Here each vector term $Y_{n,k}$ is a sum of N consecutive 1 bit input samples multiplied by the N L-bit coefficient words.

From Equation 5 we have that:

$$Y_n = \sum_{k=0}^{M-1} \left\{ Y_{n,k} \right\} 2^k$$

This is just the sum of the $Y_{n,k}$ terms of Equation 6 with appropriate shifts, and can be easily performed by a pipeline adder tree at the output.

The above equations lead to a straight-forward architecture which does not use "multipliers".

Architecture for Implementation of the Algorithm

A simplified block diagram is provided in FIG. 2 which implements the algorithm of the previous section. The final output $Y_n$ is obtained by adding the $Y_{n,k}$ outputs, after appropriate shifts, using the pipeline adder tree shown in FIG. 3a. This architecture is the transpose of the one proposed by Greenberger, op. cit. It uses somewhat less complex circuitry than Greenberger, but offers no significant advantage.

Although the algorithm yields a straight forward structure which does not use any "multipliers", the gate count is prohibitively high, nearing that of a full multiplier filter structure. Thus it suffers from the same problem as Greenberger, making it unsuitable for efficient VLSI implementation. This structure does have the advantage of higher speed than a multiplier implementation (total latch to latch delay is only an AND gate and an Adder), but not much of an advantage as far as gate count is concerned.

To reduce gate count without compromising speed we will modify our algorithm.

Modified Algorithm with Merged Bit Planes

From Equation 5 we have:

$$Y_n = \sum_{k=0}^{M-1} \left\{ Y_{n,k} \right\} 2^k$$

This can be expressed, without loss of generality, as:

$$Y_n = \sum_{k=0}^{a} \left\{ Y_{n,k} \right\} 2^k + \sum_{k=a+1}^{b} \left\{ Y_{n,k} \right\} 2^k + \ldots + \sum_{k=d+1}^{M-1} \left\{ Y_{n,k} \right\} 2^k \quad (7)$$

where a, b, ... d are integers such that $$0 \leq a \leq b \leq \ldots d \leq M-1$$

We have just expressed the larger summation term as a sum of smaller number of summation terms both yielding the same $Y_n$. To show the effect it will have on the implementation, we will present a typical example.

Figure 4:
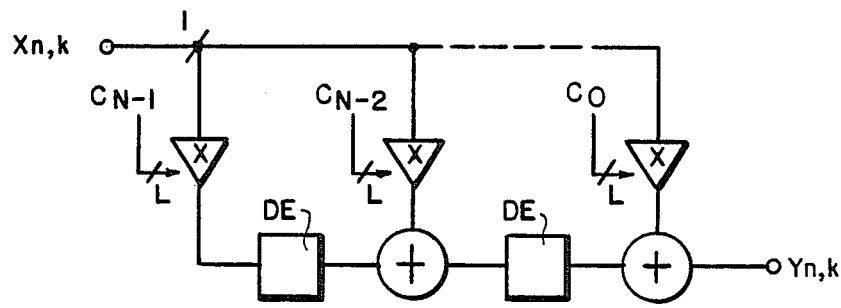
FIG. 4 is a block diagram of the structure for calculating the output $Y_{n,k}$ in a partial word slicing algorithm.

Assume a filter where coefficients are expressed as L bit binary words and the data as 8 bit binary words. Equation 5 becomes:

$$Y_n = \sum_{k=0}^{7} \left\{ Y_{n,k} \right\} 2^k \quad (5a)$$

where each term in the bracket is calculated by the structure of FIG. 4, and there will be 8 such structures (planes), each calculating a $Y_{n,k}$ in parallel.

Now expressing Equation 5a in the form of Equation 7 we get:

$$Y_n = \sum_{k=0}^{1} \left\{ Y_{n,k} \right\} 2^k + \sum_{k=2}^{3} \left\{ Y_{n,k} \right\} 2^k + \sum_{k=4}^{5} \left\{ Y_{n,k} \right\} 2^k + \sum_{k=6}^{7} \left\{ Y_{n,k} \right\} 2^k \quad (8)$$

where a, b, c and d of Equation 7 are 1, 3, 5 and 7 respectively, so that each summation term therein is for 2 bits. We now examine one of the four summation terms in detail. From Equation 8 and Equation 5 we have:

$$Y_{n,0:1} = \sum_{k=0}^{1} \left\{ Y_{n,k} \right\} 2^k = \quad (9)$$

$$\sum_{k=0}^{1} \left\{ \sum_{i=0}^{N-1} x_{n-i,k} \sum_{j=0}^{L-1} c_{i,j} 2^j \right\} 2^k$$

The term inside the brackets is comprised of sums of 1 bit by L bit products, which are then added together after shifting one position for each increment over k. By rearranging Equation 9 we have:

$$Y_{n,0:1} = \sum_{i=0}^{N-1} \left\{ \sum_{k=0}^{1} x_{n-i,k} 2^k \sum_{j=0}^{L-1} c_{i,j} 2^j \right\} \quad (10)$$

Figure 5:
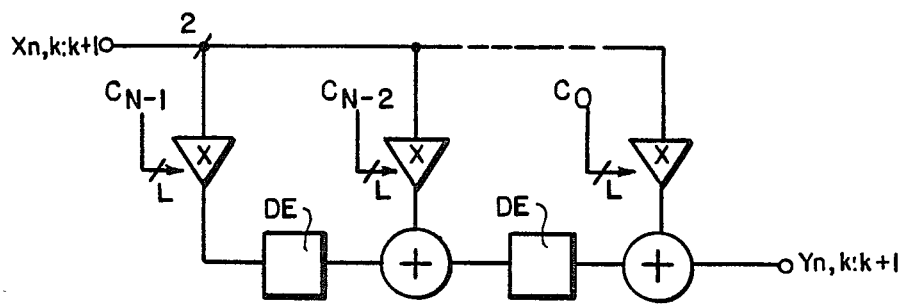
FIG. 5 shows the architecture for implementing the first embodiment of the modified algorithm.

The term in brackets is composed of 2 bit by L bit products, which are then serially added. Each of the bracketed terms can be implemented by the circuit in FIG. 5.

By the above manipulation we have merged two adjacent 1 bit data planes into one 2 bit data plane, thus reducing the number of planes in our original structure of FIG. 2 by half. In doing so we have increased the complexity of each plane also, for it now performs a 2 bit by L bit multiplication equivalent instead of 1 bit by L bit multiplication equivalent.

The reduction in hardware complexity obtained from the reduction in the number of planes more than offsets the increase caused by the more complex multiplication equivalents. The 2 bit by L bit multiplication equivalent can be easily accomplished by a simple circuit to be explained in the following section.

2 Bit by L Bit Multiplier Equivalent

Since the coefficient C is expressed as an L bit binary number, it is easy to see that multiplying C with a two bit number will result in one of the following results:

The working of the "muliplier-equivalent" is explained by describing the operation of the filter of the present invention. Like most filters, this filter works in two phases: (i) initialization and (ii) normal operation. Both these operations can take place simultaneously for adaptive filter operations, to be discussed shortly.

Figure 6A:
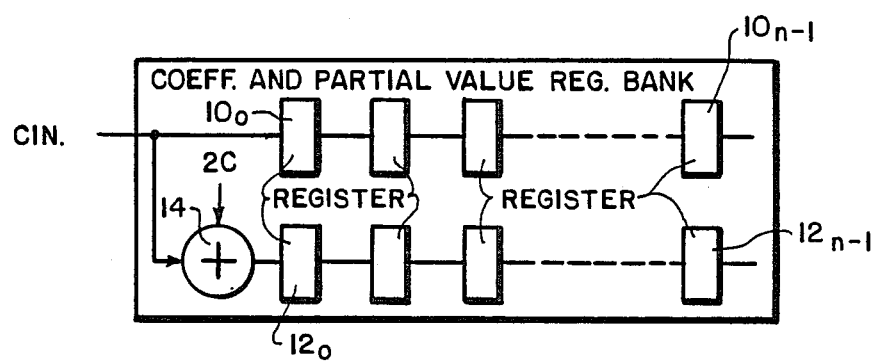
FIG. 6a is a block diagram of the registers for storing a coefficient and an odd multiple of the coefficient.

(i) Initialization:

In this phase the coefficients C are loaded into the filter serially before the start of filter operation. This is shown in FIG. 6a wherein the coefficients are stored in registers $10_0$ to $10_{n-1}$. Once they are loaded, the values remain in registers until a new set of values is fed in. We make a provision in our circuit so that the value, 3C, is simultaneously calculated and stored in similar registers $12_0$ to $12_{n-1}$ when C is being loaded, as shown in FIG. 6a. This is accomplished by shifting C to obtain 2C and adding 2C to C in adder 14. At the end of the loading cycle we will have C and calculated 3C stored in registers for all the coefficients. The operation of calculating and storing 3C values is totally transparent to the user.

Figure 6B:
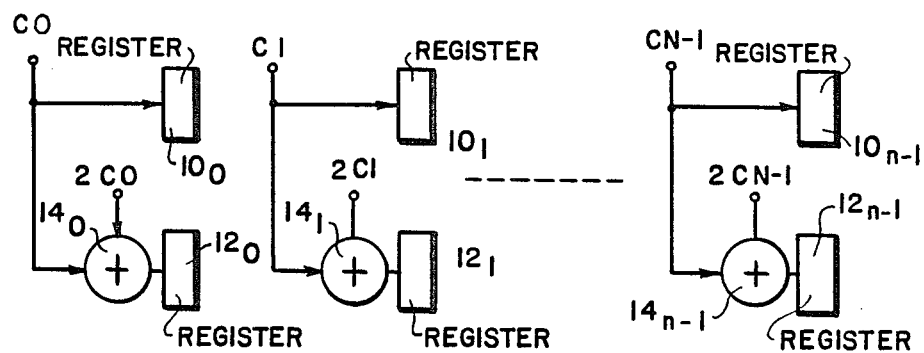
FIG. 6b is a modification of FIG. 6 for adaptive filtering.

For adaptive filter operations, in which coefficients can be expected to change in every cycle, the loading of the coefficients C and calculation of partial products 3C takes place in parallel as shown in FIG. 6b. The price is paid in increased I/O pin-numbers and (N-1) additional adders $14_0$ to $14_{n-1}$.

Figure 7:
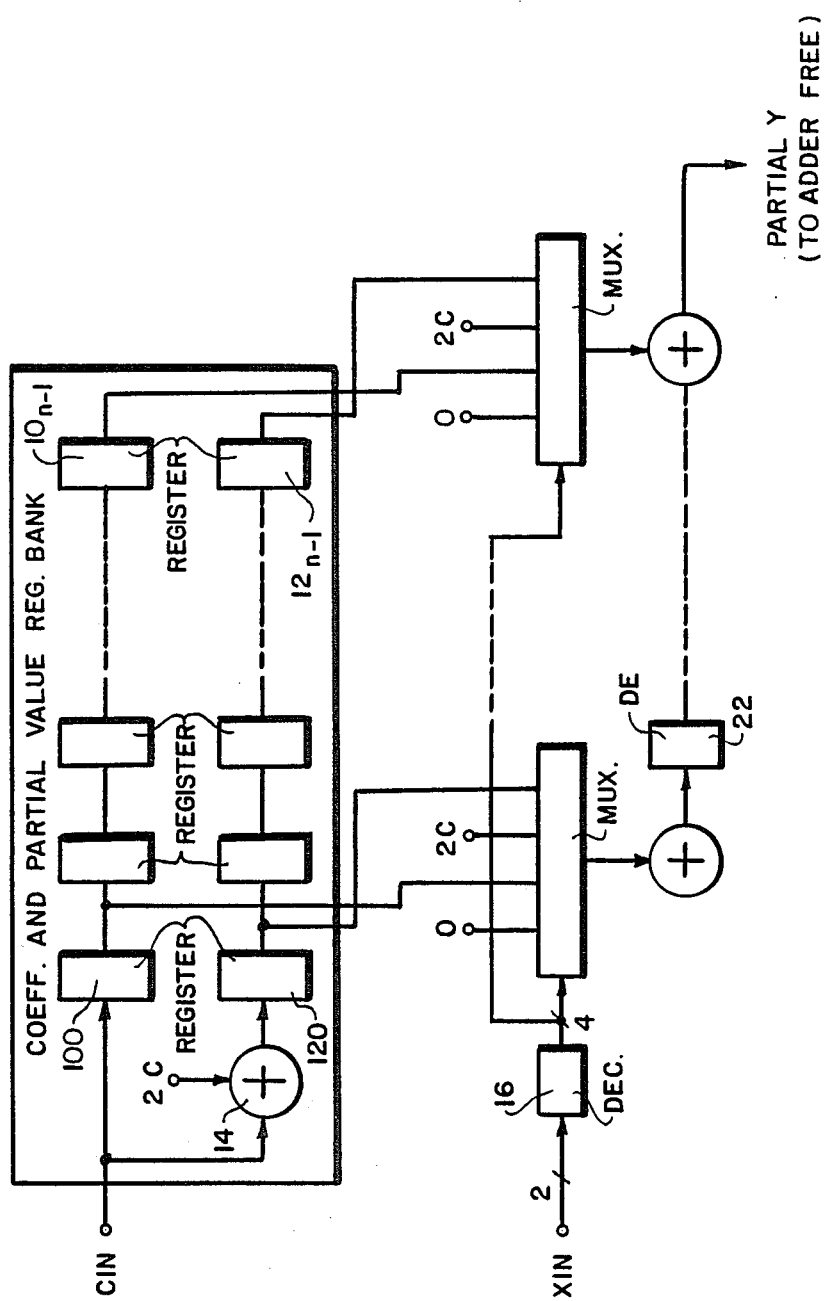
FIG. 7 is a block diagram of a two bit by L bit multiplier equivalent.

(ii) Normal Operation:

In the normal operation phase we can now perform a 2 bit by L bit multiplication equivalent using the simple circuit shown in FIG. 7. Note that 2C is just a shifted version of C, and does not require additional register banks to store. Depending on the decimal value of the 2 bit input word $X_{n,k:k+1}$ one of the four values 0, C, 2C, 3C, will be selected by the 2-to-4 decoder 16 and provided through a multiplexer $18_0$ to $18_{n-1}$ for addition by adder $20_0$ to $20_{n-1}$ to other terms. The delay elements $22_0$ to $22_{n-1}$ are standard in an FIR filter. This is a very fast and hardware efficient implementation.

Figure 3B:
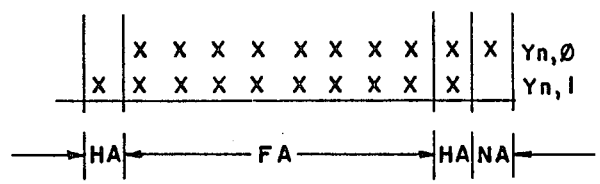

Similar operations will be taking place simultaneously in 4 other planes (for an 8 bit input word) in parallel. The result from the outputs of these planes are then added by a simple pipeline adder tree. This adder tree is also reduced in complexity since now it has to add partial results from half the number of planes than before. Examples of pipeline adder trees are shown in FIGS. 3a and 3b.

3 Bit By L Bit Multiplier Equivalent

The number of planes can be further reduced by using 3 bit by L bit multiplication equivalents per plane rather than the 2 bit by L bit multiplication equivalents, as described supra.

Figure 8:
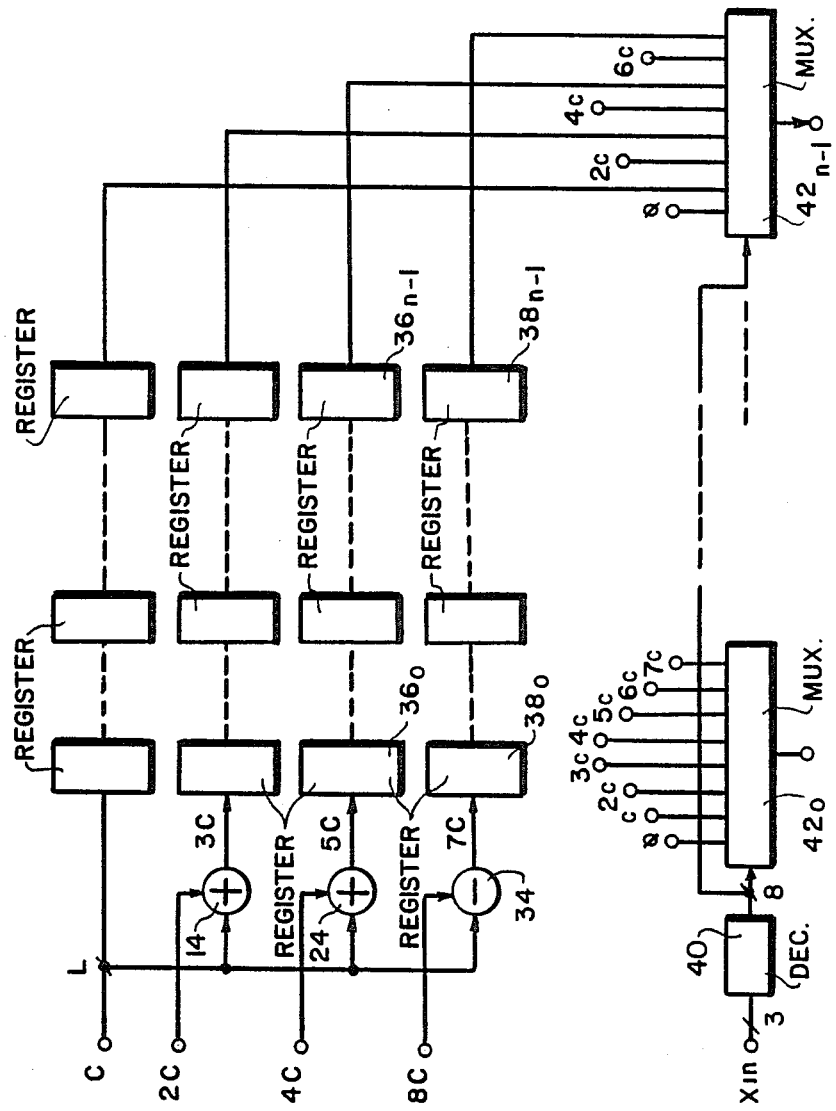
FIG. 8 is a block diagram of a three bit by L bit multiplier equivalent.

We perform 3 bit by L bit multiplication equivalent in a similar fashion by precalculating and storing in registers the values of 2C, 3C, 4C, 5C, 6C and 7C as the value of C is being loaded in. Note that we do not need registers for 2C, 4C and 6C as they are just shifts of C, 2C and 3C respectively. In FIG. 8, for example, $2C_0$, $4C_0$ and $8C_0$ are merely shifts of $C_0$. $3C_0$ and $5C_0$ are calculated by adding $C_0$ to $2C_0$ and $4C_0$ respectively in additional adders 14, 24. $7C_0$ is calculated by subtracting $C_0$ from $8C_0$ which is a shift of 4C, in subtractor 34. No register is needed for $6C_0$ because it is a shift of $3C_0$. Thus, increasing the multiplier-equivalent-per-plane complexity to 3 bit by L bits requires only additional register banks $36_0$ to $36_{n-1}$ and $38_0$ to $38_{n-1}$ for 5C and 7C, as shown in FIG. 8.

However, the decoder and multiplexer equivalent complexity increases also. Decoder 40 which receives the three-bit input slice is a 3-to-8 decoder which selects one of eight possible multiples of each C for multiplexers $42_0$ to $42_{n-1}$. The output of the multiplexers is fed to the pipeline adder tree of FIGS. 3a and 3b. It then must be decided which partition size is most feasible for a given application. The procedure explained in the following section may be undertaken to determine the optimal size of this partitioning.

Choosing the Optimal Size of Partitioning

We have shown two of the many possible partitions/slices in which the filter can be implemented. In the selection of partition slice size there is an obvious tradeoff between the coefficient bank storage requirement and the arithmetic circuitry required. We note that as we move from a 2 bit by L bit multiplier equivalent to a 3 bit by L bit multiplier equivalent we reduce our arithmetic complexity (reducing the number of planes) but increase our coefficient bank storage requirement (requiring registers for 5C and 7C).

The issue is to identify the partitioning which optimizes the complexity of the architecture. To accomplish this, a linear program was written (see appendix 1) where the gate count was based on the TI standard cell library. It turns out that the "optimum" partitioning is a function of input sample word length. For a 9 bit input word length, the "optimum" partitioning is 3 planes of 3 by L bit "multipliers", or multiplier equivalents. For an 8 bit input sample word, 4 planes of 2 by L bit "multipliers" were the best, although, using 2 planes of 3 bit by L bit and one of 2 bit by L bit multiplier equivalent resulted in a circuit of almost similar complexity.

Modified Design to Allow Negative Numbers

The algorithm as presented so far is valid only for positive values of the input and coefficients. It can be easily extended, with a modest increase in circuitry, to operate over all four quadrants of multiplication of the convolution sum of Equation 1.

Different ways have been proposed of doing this. A procedure based on negative radix numbers representation, proposed by Wadel, L. B. Wadel, "Negative Base Number System", IRE Trans. Electron Comput. (Corresp.), Vol. EC-6, p. 123, June 1957, and used for a similar application in Zohar, S. Zohar, "New Hardware Realizations of Non-Recursive Digital Filters", IEEE Trans. on Computers, Vol. C-22, No. 4, April 1973, pp. 328–338, can be employed here. But for simplicity of expression we used the technique of applying bias to both data and coefficients so that only positive numbers are involved. This method is mentioned in Zohar and used in Greenberger for four quadrant filter operation.

In the case when both M bit inputs and L bit coefficients have sign bits, positive offsets can be added to both of them so that the resultant is always positive.

$$C_i' = C_i + C_o \quad (1)$$

$$X_{n-i}' = X_{n-i} + X_i \quad (2)$$

where $C_0$ and $X_0$ are positive offsets applied to make $C_i'$ and $X_{n-i}'$ always positive.

Substituting $C_i'$ and $X_{n-i}'$ in Equation 1 we get:

$$Y_n = \sum_{i=0}^{N-1} C_i' X_{n-i}' \quad (13)$$

$$Y_n = \sum_{i=0}^{N-1} (C_i + C_o)(X_{n-i} + X_o) \quad (14)$$

$$Y_n = \sum_{i=0}^{N-1} C_i X_{n-i} + \quad (15)$$

$$\left[ C_o \sum_{i=0}^{N-1} X_{n-i} + X_o \sum_{i=0}^{N-1} C_i + N X_o C_o \right]$$

Figure 9:
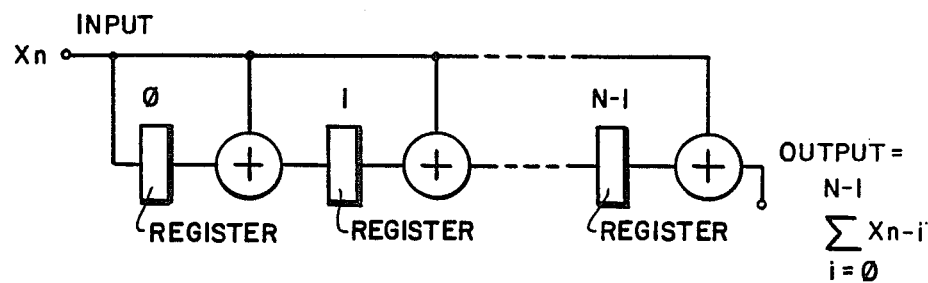
FIGS. 9 and 10 are block diagrams of circuits used in a modified architecture for negative numbers.
Figure 10:
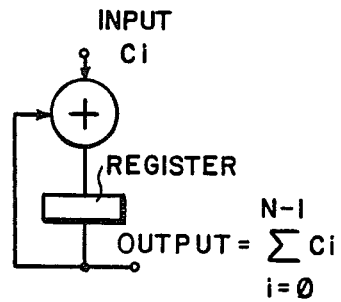

It is clear that the term in brackets will have to be subtracted from Equation 15 in order to retrieve the expression of Equation 1. The third term in the bracket is just a constant and can be precalculated and stored. The other two terms in the bracket can be calculated by the simple circuits of FIG. 9 and FIG. 10. These terms are then subtracted from the final output of the filter by incorporating the subtractor in the pipeline adder tree of FIGS. 3a or 3b. *It should be pointed out that $C_0$ and $X_0$ are just appropriate powers of 2 scaling corresponding to the most significant bits of the coefficient and data word lengths.*

With this simple modification, the filter can handle negative numbers, and hence is capable of four quadrant operation.

Extension of the Resolution of Input Data, Filter Coefficient and Filter Length The filter with resolution M bits for input, L bits for the coefficient and of length N (the number of coefficient or taps) as described above can be used as a basic building block to design any filter of arbitrary length and resolution for both data and coefficients.

Increasing Input Resolution

Figure 11:
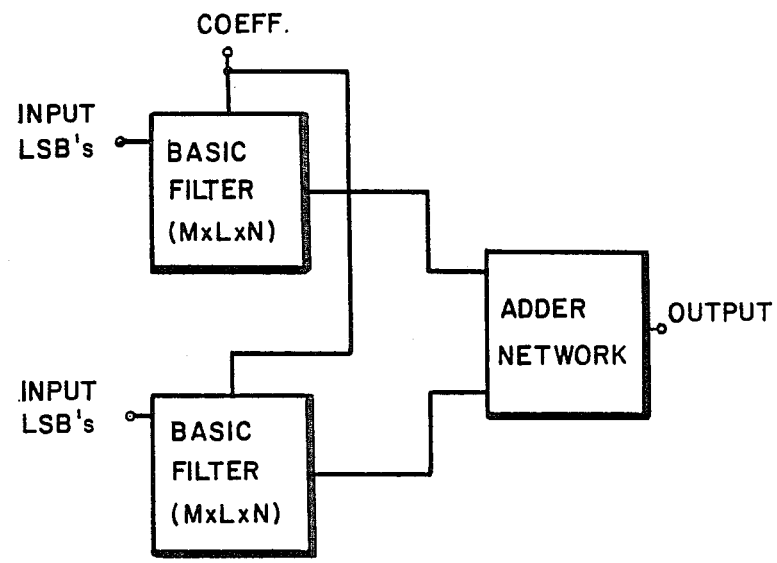
FIG. 11 is a block diagram of a cascade for input resolution extension.

For example, if the input resolution is to be doubled, it can be handled as shown in FIG. 11. Both filters of size $M \times L \times N$ receive same set of N coefficients but one of them receives the M least significant bits, LSBs, of input data and the other is supplied with the M most significant bits, MSBs. When the two outputs are added with appropriate M bit shift, the final output is from a filter of equivalent size $2M \times L \times N$.

Increasing Coefficient Resolution

Figure 12:
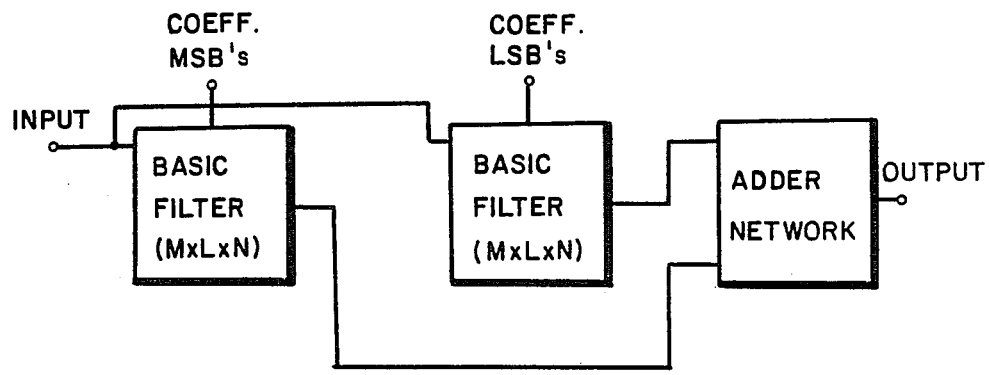
FIG. 12 is a block diagram of a cascade for coefficient extension resolution.

Increased coefficient resolution is dealt with by the architecture given in FIG. 12. Here, assuming the desired filter is of size $M \times 2L$ by N, the MSB L bits and LSB L bits are supplied to two different basic blocks of size $M \times L \times N$ receiving same M bit input. Final output is obtained by adding their output with a L bit shift.

Figure 13:
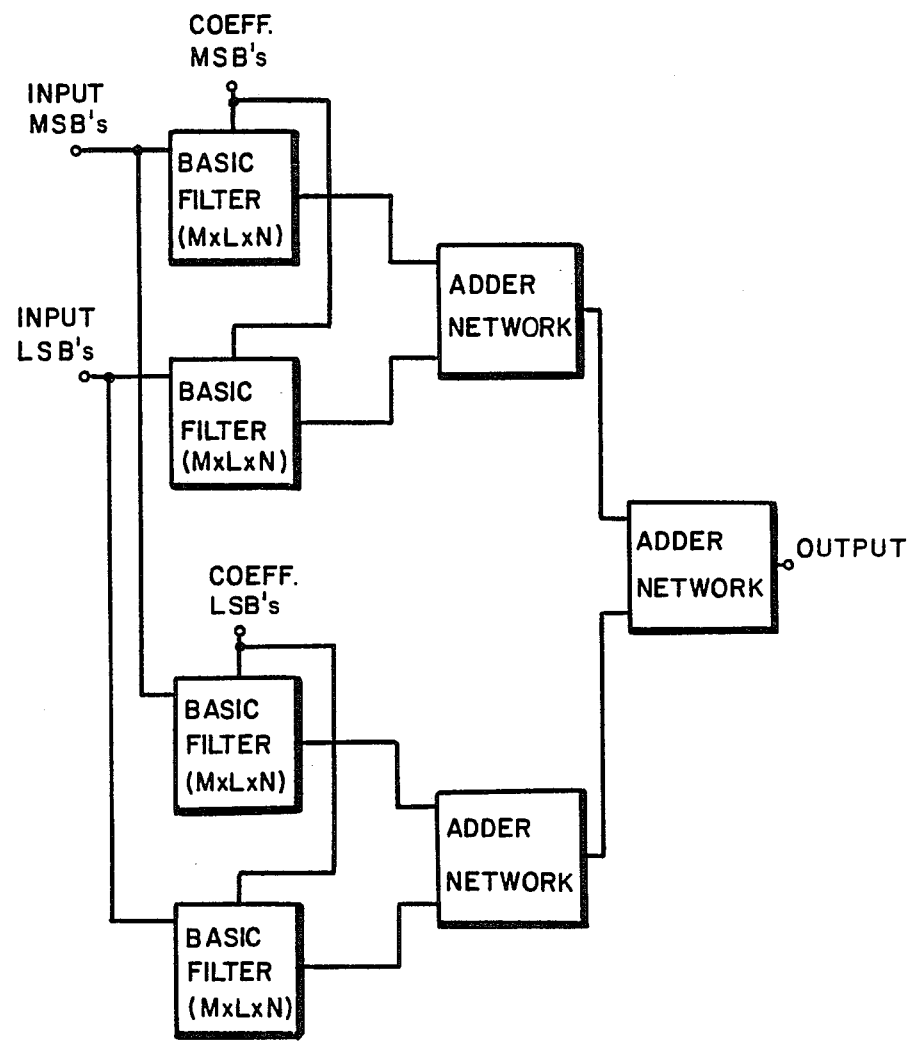
FIG. 13 is a block diagram of a cascade for both input and coefficient extension resolution.

Whe simultaneous increase of resolution of both input and coefficient is desired, four basic blocks are used as shown in FIG. 13 to form a pair of filters of size $2M \times L \times N$ as described supra. Each filter of the pair has the same input resolution 2M but one of them is supplied with L LSBs of the coefficients and the other get L MSBs. When their outputs are added with a L bit shift, output of a filter of size $2M \times 2L \times N$ is produced. Thus the resolution of both input and coefficient can be increased arbitrarily by multiple use of basic blocks as described supra and adding their output with proper shifts.

Increasing Filter Length

In all of the above, we assumed filters of length N. But the basic block can also be used to produce filters of arbitrary length. In the following, we described a way to double the filter length. The convolution of Equation 1 changes to the following for increased filter length, 2N:

$$Y_n = \sum_{i=0}^{2N-1} C_i X_{n-i} \quad (16)$$

By dividing it into two convolutions of length N we have, $$Y_n = \sum_{i=0}^{N-1} C_i X_{n-i} + \sum_{i=N}^{2N-1} C_i X_{n-i} \quad (17)$$

Changing the index of the second summation we get, $$Y_n = \sum_{i=0}^{N-1} C_i X_{n-i} + \sum_{j=0}^{N-1} C_{j+N} X_{i-N-j} \quad (18)$$

Figure 14:
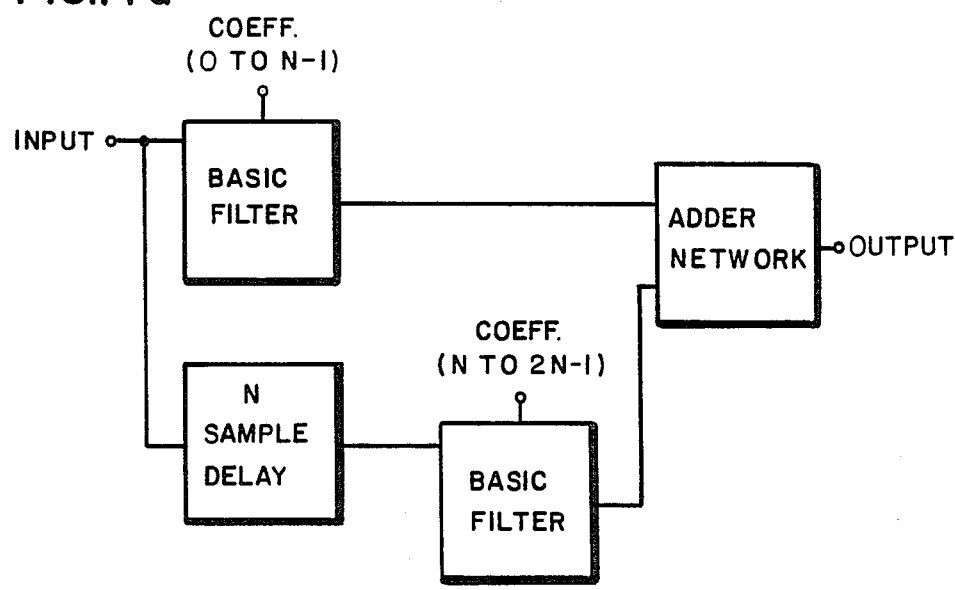
FIG. 14a is a block diagram of a parallel cascade for increased filter length.
FIG. 14b is a block diagram of a cascade for arbitrary filter length extension.
Figure 14:
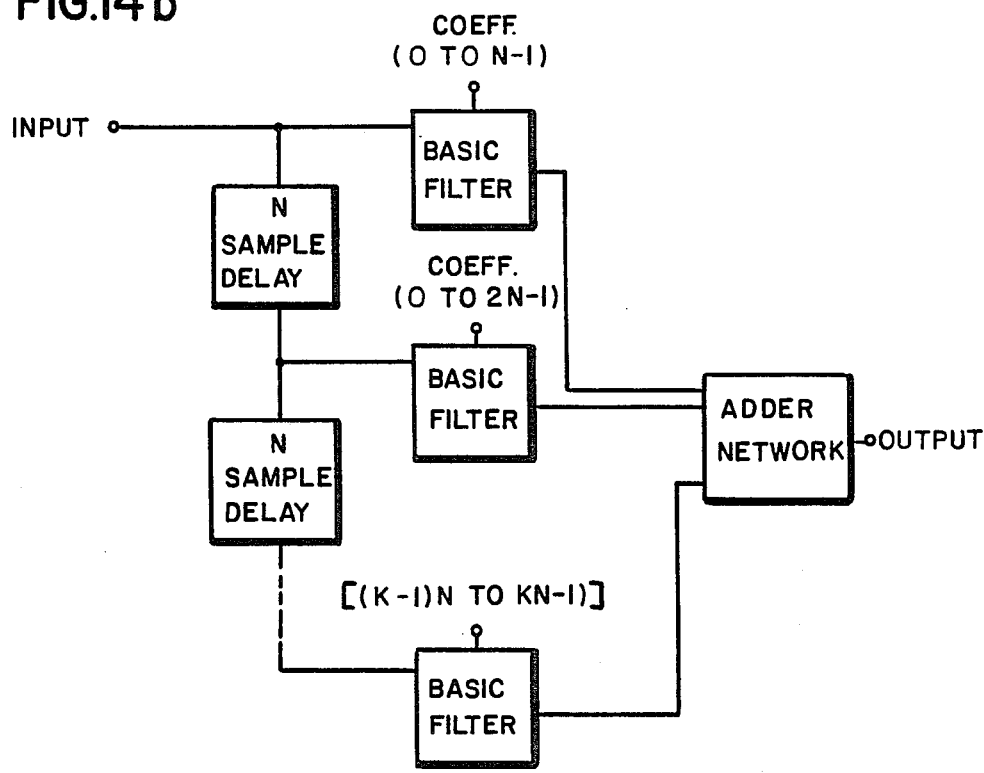

Note that the first summation term in Equation 18 is the same as that of Equation 1 and can be implemented by a single basic block. The second term of Equation 18 is also a convolution of length N with the N remaining coefficients, and the inputs after an N sample delay. Thus, by using a pair of basic filler blocks, a delay of N samples and an adder we can easily implement a filter of size $M \times L \times 2N$ as shown in FIG. 14a. Since each filter uses N coefficients independently, the length of the adders need not be increased to prevent overflow. This would not be the case if they would be connected back to back to produce one long filter. The length can be increased arbitrarily by making successive use of the basic block, as long as each block is supplied with inputs with additional delay of N samples, as shown in FIG. 14b. The outputs are combined using a pipeline adder tree shown as the adder network in FIGS. 14a and 14b.

Minimization of Pipeline Adder Tree Complexity

The pipeline adder tree adds the final output of all the planes, with appropriate shifts, as shown in FIG. 3a. These shifts are over the variable k, as expressed in Equation 5.

Figure 3C:
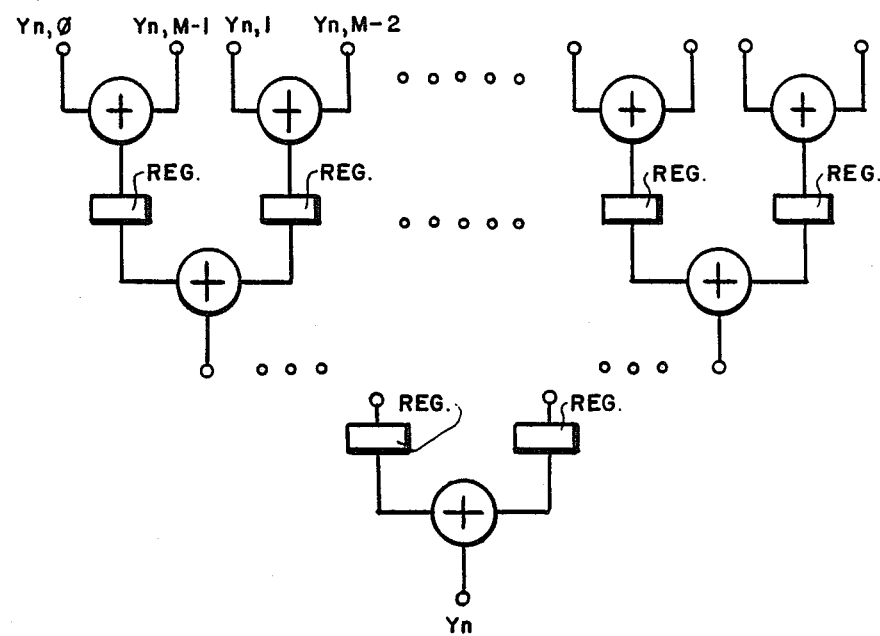
FIG. 3c is a block diagram of a pipeline adder tree using minimal components.
Figure 3D:
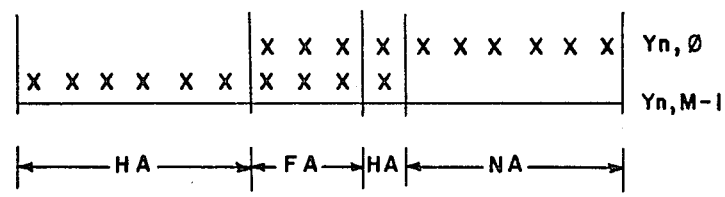
FIG. 3d is an example of an addition with minimal components.

In FIG. 3a, we have shown the $Y_{n,k}$ as being added in sequence. It turns out that minimum circuit complexity results when extreme $Y_{n,k}$ terms are grouped together for addition. Refer to Equation 8. There will be least overlap between the first and the last term because of the difference in the relative shifts, and this overlap would require the least circuitry. This is explained with an example and the resulting saving of circuitry in FIGS. 3c and 3d. FIGS. 3b and 3d indicate the adders and half-adders required for each embodiment.

It is clear that while implementing the pipeline adder tree, the sequence of the terms can be optimally chosen, while maintaining the correct shifts, to minimize the tree's circuit complexity.

VLSI Implementation

Figure 15:
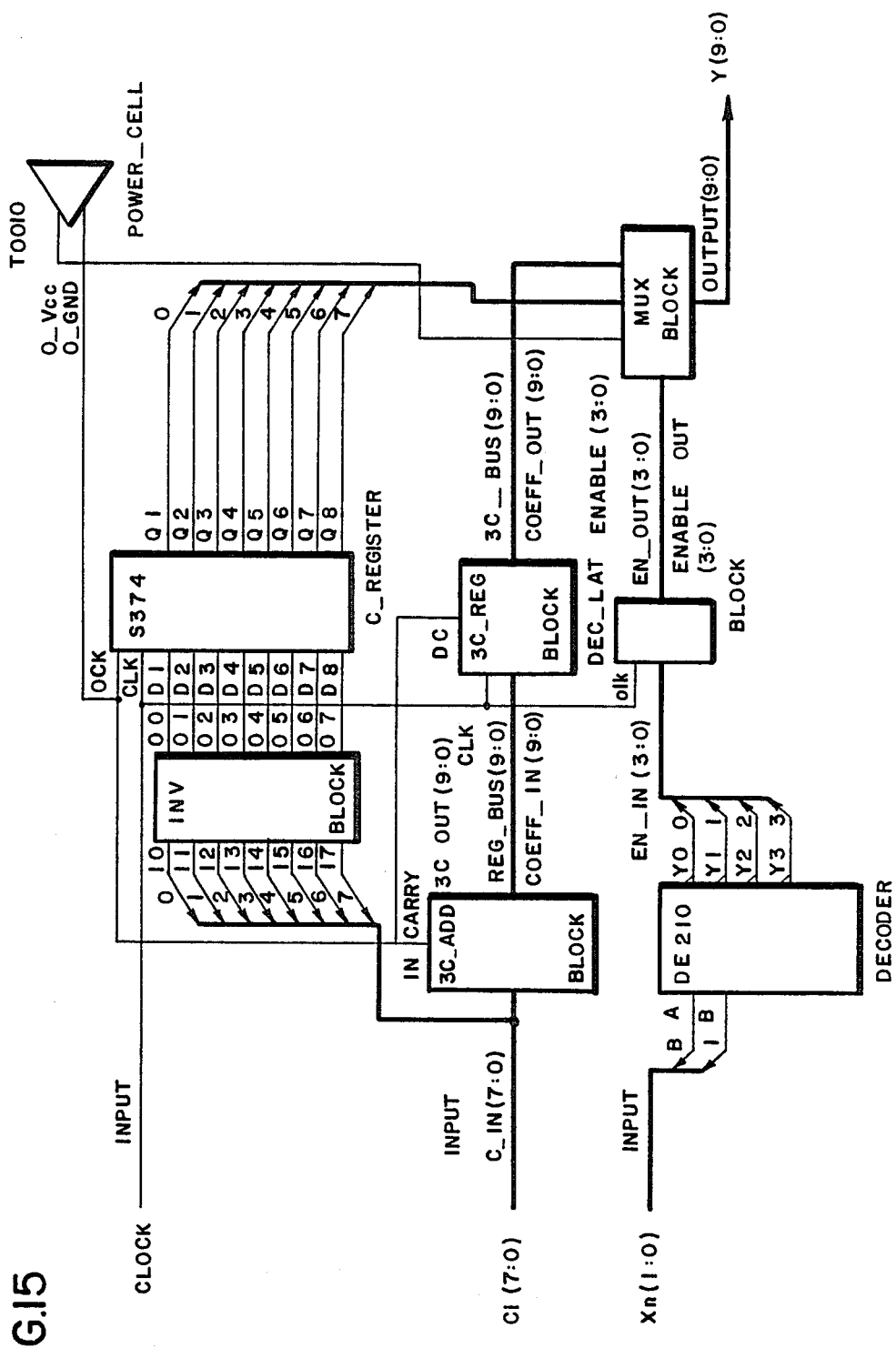
FIG. 15 is a block diagram of a one coefficient one plane filter according to the invention.

A one coefficient (one tap), one plane filter was constructed to demonstrate the working of our concept. For fast turnaround time Standard Cell implementation was chosen. The prototype was simulated using Texas Instrument (TI) 2 micron, double metal Standard Cell Library on the Mentor workstation. Since the purpose of implementation was to outline the speed and hardware simplicity of multiplication equivalent, only the "multiplier" equivalent was constructed and no adders were included. FIG. 15 shows the block diagram of the one coefficient, one tap, one plane filter. A 2 bit by L bit "multiplier" was chosen for simplicity.

Referring to FIG. 15, the 3C_ADD is the "coefficient bank" adder which calculates 3C as C is being loaded in the initialization phase. After the initialization phase has been completed C_REG and 3C_REG hold the values of C and 3C respectively. In the operation phase, the DECODER-MUX combination selects and makes available one of the precalculated partial products. This operation time is our "multiplication" time. The MUX was designed with two important objectives in mind:

(i) Circuit simplicity and high speed
(ii) Speed of operation to be independent of coefficient or data word length.

Figure 16:
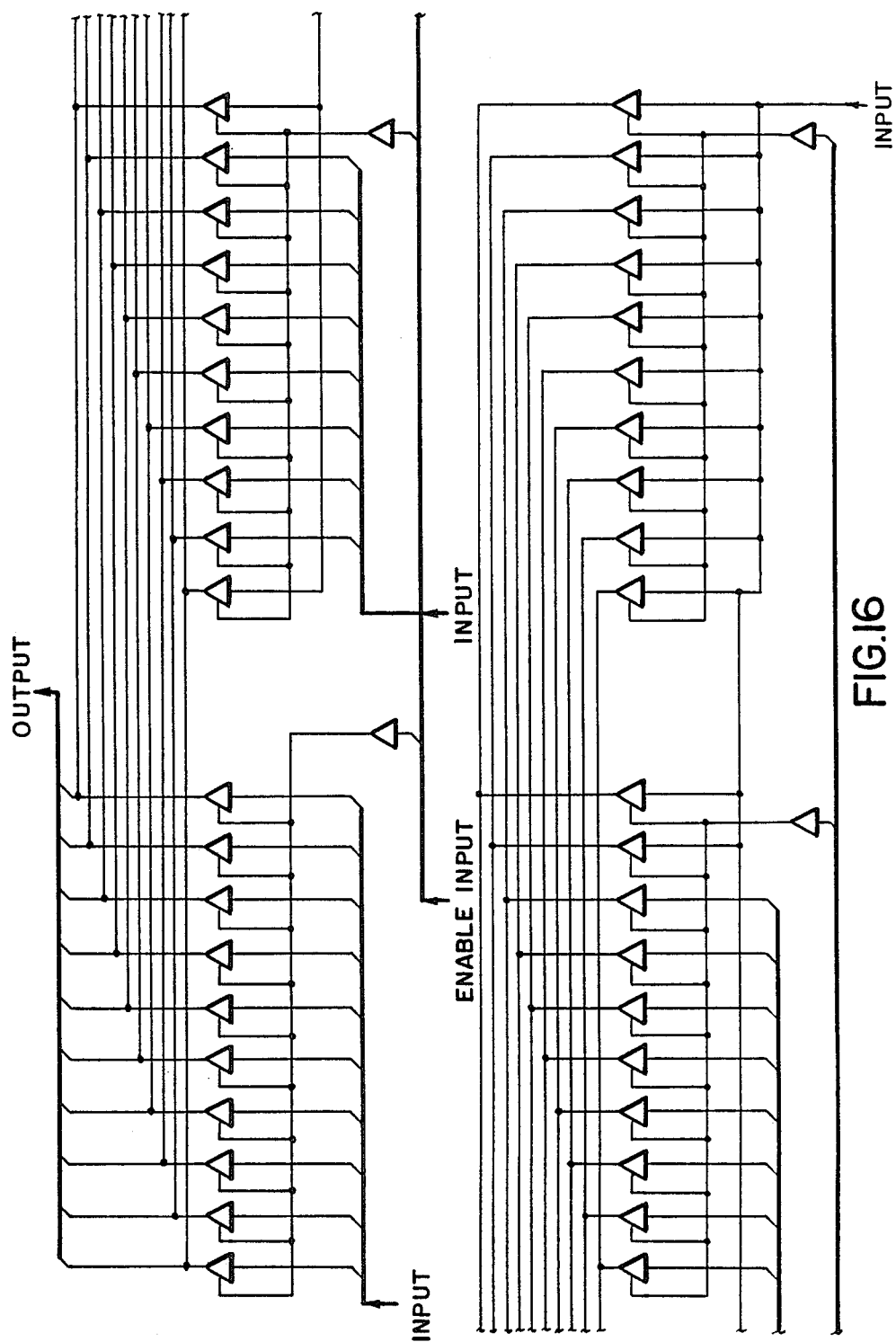
FIG. 16 is a circuit diagram of the multiplexer used in the filter of FIG. 15.

For this purpose tri-state gates were used (FIG. 16) instead of the usual AND-OR-INVERTERS, which would have made the operational speed word length dependent.

Simulation

In the simulation setup procedure, each input signal is defined through a force statement and all outputs are generated by the simulation software. Since the objective of the simulation was to demonstrate the working of the concept and show the speed of "multiplication" and not to find the maximum filter operation speed, both initialization and normal operation were performed simultaneously.

Analysis of Simulation Results

The motive of the construction and simulation of this design is to demonstrate the working of the concept. So besides making sure that loading and subsequent "selection" of coefficient/partial product take place correctly (operational testing), we are primarily interested in the features which differ from currently existing topologies. These features are (i) coefficient/partial product loading speed and (ii) multiplication speed (Speed testing).

(a) Operational testing

As mentioned earlier, for illustration purposes both loading and normal operation take place simultaneously in the simulation. Briefly describing the operation, the following takes place. C and $X_{n,k:k+1}$ (two bits) are presented to the circuit. 3C is calculated and $X_{n,k:k+1}$ is decoded. At the clock pulse these present values of C, 3C and decoded $X_{n,k:k+1}$ are loaded in their respective registers. The decoded value of $X_{n,k:k+1}$ selects one of 0, C, 2C or 3C and this appears at the output.

Simulation results verified that the circuit is operationally correct. Now we concentrate on the timing/speed of the multiplication equivalent.

(b) Speed testing (i) Coefficient/partial product loading speed

It is clear from the circuit of FIG. 6 that this time primarily depends on the addition time of the 3C adder. Simulation results show that this speed to be 11.3 ns. We used TI Standard Cell partial carry look-ahead adders and it is obvious that this speed could be substantially increased by using full carry look ahead adders.

(ii) Multiplication speed

In analyzing the result for multiplication equivalent speed we bear in mind that the time we are interested in is the time it takes for the partial product (0, C, 2C or 3C) to arrive at the MUX output once the decoded input $X_{n,k:k+1}$ has been provided to it. Notice that we should not include the DEC_LAT setup time because not only is this technology dependent (as is every other time in this circuit) but is present in every other type of filter too (multiplier or multiplierless) since the input data will have to be latched in all cases, and is not unique to our architecture.

Keeping this in mind we probed our multiplier equivalent at the input and output and found that the multiplication equivalent time is only 4.8 ns (independent of word length).

Some Comparative Results

This filter achieves the same speed of operation as the architecture proposed by Greenberger. This claim can be demonstrated to be accurate by simulation. This filter also achieves substantially reduced hardware complexity for efficient VLSI implementation. This we shall demonstrate now.

Referring to Table 1, column 2 shows the transistor count as estimated by Greenberger. The filter length was 64 taps, with 8 bits each in the coefficient and data words. Column 3 shows the transistor count for our filter structure of the same length and word size. Note that our count is directly extrapolated from Greenberger's table, and can be further reduced using considerations outlined at the end of this section.

TABLE 1

| Comparative Transistor Counts for 64 Tap Filter | | |
|---|---|---|
| | Transistors Used in Greenberger | Transistors Used Herein |
| Coefficient Latches | 8,192 | 16,384 |
| NAND/Tri-State Gates | 16,384 | 32,786 |
| Accumulators | 408,576 | 204,286 |
| Pipelined Adder Tree | 5,936 | 2,544 |
| Four Quadrant Operation | 20,000 | 20,000 |
| Misc. and Contingency | 50,000 | 1,000 |

TABLE 1-continued

Comparative Transistor Counts for 64 Tap Filter

|  | Transistors Used in Greenberger | Transistors Used Herein |
|---|---|---|
| Total Transistors | 509,088 | 276,982 |

From the above it is evident that we have achieved more than 45% reduction in transistor count. In our architecture we use twice as many coefficient latches because we store 3C also. Similarly, we use 4 times as many tri-state inverters per tap, but since we have half the number of planes, the total count is only twice as much. From column 2, we see that more than 80% of Greenberger's transistor count stems from the accumulators, which we reduce by half in our 2 bit partial slice size (2 bit by L bit multiplication). The pipeline adder tree is simplified to 3/7 the original complexity. The same number of transistors are required for the four quadrant operation. Since we did not use the accumulator structure, we do not need any circuitry for controlling the output enable and reset, etc., as is required in Greenberger. So the only miscellaneous and contingency circuitry we require is one adder for the 3C register and four 2-to-4 bit decoders, which amount to about a thousand transistors.

The transistor count presented in Table 1 is for a 64 tap filter. It is obvious that more modest length filters (8–16 taps) can easily be constructed using the current VLSI technologies.

As was mentioned earlier, the transistor count can further be reduced by taking other features that our architecture offers into account. For example, the pipeline adder tree can be minimized as elaborated supra. Similarly since we do no accumulate or cascade filters back to back, we do not need circuitry of maximum width. We can start with the minimum width adders and latches, and make them wider as we go along from one tap to the next. These and other similar considerations can result in transistor counts lower than the ones estimated in Table 1, enabling a far more efficient circuit and allowing more taps to be integrated per IC.

Conclusion

A new multiplierless FIR filtering algorithm has been derived. The algorithm is based on partial slicing of an input data sample word into groups of two or more bits. This algorithm is mapped onto a novel architecture which uses only adders and registers. The structure is capable of very high speed operation, well within video frequencies. The filter coefficients can be dynamically updated for adaptive filtering applications.

The filter can easily be expanded in number of taps and/or word length of coefficient and data samples. The partial slicing of the input data sample results in tremendous reduction in the gate-count of the filter, hence making it very attractive for VLSI implementation.

By simulating a small section of the filter we have demonstrated the tremendous high speed capability of the architecture. The architecture is technology independent, but the highest attainable speed of filter operation is of course technology dependent. For some not so demanding tasks, (<15 MHz.), a standard cell implementation of this architecture may make sense because of its full precision of multiplication equivalent and relatively low transistor count. But for very high frequency use, (>30 MHz.), as is the case in video and HDTV applications, it is suggested that a full custom approach is most suited. Such an approach maximizes the advantages offered by the architecture, and attains the best speed performance. As a rough estimate of the high frequency capabilities of this architecture, consider the implementation in ECL technology. In this technology, typical 12 bit addition speeds are under 8 ns. A single buffer delay is around 1 ns, and the setup and hold times are under 1 ns each. This implies that our filter can be operated at almost a 12 ns clock/sample rate, yielding 88.34 million samples/second (88/34 MHz.) throughput rate. All this at a hardware complexity and power consumption much less than a full multiplier implementation. With CMOS speeds approaching that of ECL technology, operation around the same frequencies can easily be obtained even in CMOS technology.

We conclude that the architecture offers tremendous advantage in both speed of operation and hardware complexity reduction, while maintaining full precision of the convolution of Equation 1.

What is claimed is:

1. A multiplierless digital transversal filter comprising:
   a first set of N registers for respectfully receiving and storing respective coefficients of a set of N filter tap coefficients $C_i$, where i=0, 1, ... N−1, each coefficient having L bits in successive bit positions j, where j=0, 1, ..., L-1;
   means for receiving successive samples $x_n$ of a digital input word X, all bits of a sample $x_n$ being received in parallel and each such sample having M bits in successive bit positions k, where k=0, 1, ..., M-1;
   means to bit slice each input word sample $x_n$ into a plurality of segments, each segment having a number w of bits, each segment constituting a processing plane of said filter;
   means to perform a convolution of the w-bits of the bit-slice segment of each of said processing planes by said set of coefficients $C_i$ in parallel, each segment being convolved with said set of coefficients $C_i$, the output of each processing plane being the convolution of the w-bits of the bit slice segment thereof and the L bits of each of said set of coefficients $C_i$;
   means to add the results of all said convolutions of all of said M bits of each input word sample $x_n$, the sum so derived being $Y_n$;
   means to output said sum $Y_n$ as a filtered digital output signal sample corresponding to said input word sample $x_n$; and
   means for biasing the input word samples $x_n$ and the coefficients $C_i$ so that they represent only positive numbers, whereby said sum $Y_n$ is derived over all four possible quadrants of the results of each of said convolutions.

2. The filter of claim 1, wherein said means to perform a convolution comprises:
   multiplicaton equivalent means for determining the product of the w-bits of each of said segments by the L bits of a coefficient $C_i$, there being $2^w$ possible resultant products for each segment;
   means for controlling said multiplication equivalent means to select one of said $2^w$ possible products for each of said segments;
   means for sequentially adding the selected products of a segment by each of said coefficients, such additions being performed in parallel for said plurality of segments;

means for adding the sums of said sequential additions for all of said segments; and means to output said final sum as a filtered digital output signal.

3. The filter of claim 2 further comprising:

a second set of registers; and means to precalculate and store in said second set of registers a subset of the total number of product of the w-bits of each of said segments of said input word sample $x_n$ and the L bits of each of said set of coefficients $C_i$.

4. The filter of claim 3 wherein said subset of products is precalculated and stored in said second set of registers simultaneously with the loading of the set of coefficients $C_i$ in said first set of registers.

5. The filter of claim 2 wherein said means to selecte a product comprises:

means to shift the bits of each coefficient $C_i$ to obtain even multiples of such coefficient;

means to store precalculated odd multiples of $C_i$;

respective decoders for the respective bit-slice segment processing planes of said filter, each such decoder translating the w-bits of such bit-slice segment into $2^w$ respective outputs representing $2^w$ possible products of a multiplication of the w-bits of such bit-slice segment by $C_i$; and respective tristate multiplexers each having one gate level, regardless of the number of bits w in a bit-slice segment, each connected to the output of a respective decoder for selecting one of said $2^w$ possible products.

6. The filter of claim 2, wherein said multiplication equivalent means comprises:

respective decoders for the respective bit slice planes of said filter, each such decoder translating the w-bits of such bit-slice into a number $2^w$ of respective outputs representing $2^w$ possible products of a multiplicaton of the w-bits of a bit-slice by $C_i$;

respective tristate multiplexers each having one gate level, regardless of the number of bits w in a bit-slice, each connected to the output of a respective decoder for selecting one of said $2^w$ possible products; and delay means respectively connected to the outputs of the respective multiplexers for delaying the selected products produced at the outputs thereof.

7. The filter of claim 1 wherein said means to perform a w-bit convolution comprises:

means to multiply the w bits of a bit-slice segment by a coefficient $C_i$, there being $2^w$ possible resultant products thereof, such multiplying means producing even multiples of $C_i$ by shifting the bits thereof;

means to precalculate and store odd multiples of $C_i$ and supply such odd multiples to said multiplying means;

means for controlling said multiplying means to select one of said $2^w$ possible products for each of said segments;

means to sequentially add the selected products of a segment by each of said coefficients, such additions taking place in parallel;

means to add the sums of said sequential additions for all of said segments; and means to output said final sum as a filtered digital output signal.

8. The filter of claim 1, wherein said means to add the results of said convolutions is a pipeline adder tree.

9. The filter of claim 8, wherein said pipeline adder tree comprises:

means to calculate the $Y_{n,k}$ outputs of the additions of all of said filter planes and shift such outputs in accordance with the significance of the bits thereof, such shifts being related to the variable k in accordance with the equation $$\left[ Y_n = \sum_{k=0}^{M-1} \sum_{i=0}^{N-1} x_{n-i,k} \sum_{j=0}^{L-1} c_{i,j} 2^j \, 2^k = \sum_{k=0}^{M-1} Y_{n,k} 2^k \right]$$

$$Y_n = \sum_{k=0}^{a} (Y_{n,k}) 2^k + \sum_{k=a+1}^{b} (Y_{n,k}) 2^k + \ldots + \sum_{k=d+1}^{M-1} (Y_{n,k}) 2^k$$

in which a, b, . . . d are integers such that $a < b < \ldots < d < M-1$ and in which.

$$Y_{n,k} = \sum_{i=0}^{N-1} x_{n-i,k} \sum_{j=0}^{L-1} c_{i,j} \cdot 2^j$$

10. The filter of claim 9, wherein said pipe line adder tree comprises a plurality of half adders and full adders.

* * * * *